(12) United States Patent
Takasugi

(10) Patent No.: US 11,107,391 B2
(45) Date of Patent: Aug. 31, 2021

(54) LIGHT EMITTING DISPLAY DEVICE

(71) Applicant: LG Display Co., Ltd., Seoul (KR)

(72) Inventor: Shinji Takasugi, Tokyo (JP)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/703,013

(22) Filed: Dec. 4, 2019

(65) Prior Publication Data

US 2020/0202771 A1   Jun. 25, 2020

(30) Foreign Application Priority Data

Dec. 20, 2018 (JP) .............................. JP2018-238137

(51) Int. Cl.
*G09G 3/32* (2016.01)
*G09G 3/3233* (2016.01)
*H01L 27/15* (2006.01)

(52) U.S. Cl.
CPC ............. *G09G 3/32* (2013.01); *G09G 3/3233* (2013.01); *H01L 27/156* (2013.01); *G09G 2300/0819* (2013.01); *G09G 2300/0852* (2013.01); *G09G 2300/0861* (2013.01); *G09G 2310/0278* (2013.01)

(58) Field of Classification Search
None
See application file for complete search history.

(56) References Cited

U.S. PATENT DOCUMENTS

| 2008/0030440 | A1* | 2/2008 | Uchino | G09G 3/3233 345/82 |
| 2013/0093800 | A1* | 4/2013 | Shim | G09G 3/3233 345/690 |
| 2014/0292734 | A1* | 10/2014 | Pyon | G09G 3/3233 345/211 |
| 2018/0108295 | A1* | 4/2018 | Ebisuno | H01L 27/1255 |
| 2019/0266928 | A1* | 8/2019 | Kim | G09G 3/32 |

(Continued)

FOREIGN PATENT DOCUMENTS

| JP | 2005-258407 A | 9/2005 |
| KR | 10-2007-0027265 A | 3/2007 |

(Continued)

OTHER PUBLICATIONS

KR-20120138924 machine translation downloaded from Google Patent Mar. 13, 2021 (Year: 2012).*

*Primary Examiner* — Dorothy Harris
(74) *Attorney, Agent, or Firm* — Seed IP Law Group LLP

(57) ABSTRACT

A light emitting display device, includes: a plurality of pixels arranged in a matrix form, each of the plurality of pixels including: a light emitting element in which a light emitting diode is between an anode and a cathode; a light emission transistor, one of a source or a drain of the light emission transistor is connected to the anode; a driving transistor, one of a source or a drain of the driving transistor is connected to the other of the source or the drain of the light emission transistor; and an initialization transistor which is configured to connect a gate of the driving transistor, the one of the source or the drain of the driving transistor, and the anode, the anode being connected to an initialization voltage line of a fixed voltage at a same time, wherein initialization transistor has a resistance greater than the driving transistor.

8 Claims, 9 Drawing Sheets

(56) References Cited

U.S. PATENT DOCUMENTS

| | | | | |
|---|---|---|---|---|
| 2019/0279567 A1* | 9/2019 | Hwang | ............... | H01L 27/124 |
| 2019/0295469 A1* | 9/2019 | Umezawa | ............ | G09G 3/3233 |
| 2020/0286432 A1* | 9/2020 | Zhang | ................. | G09G 3/3266 |
| 2020/0302863 A1* | 9/2020 | Xuan | ................... | G09G 3/3208 |

FOREIGN PATENT DOCUMENTS

| | | | |
|---|---|---|---|
| KR | 10-2012-0138924 A | | 12/2012 |
| KR | 20120138924 A | * | 12/2012 |
| KR | 10-2013-0026338 A | | 3/2013 |
| KR | 10-2014-0116702 A | | 10/2014 |

* cited by examiner

LIGHT EMITTING DISPLAY DEVICE

CROSS-REFERENCE TO RELATED APPLICATION(S)

The present application claims the priority benefit of Japanese Patent Application No. 2018-238137 filed in Japan on Dec. 20, 2018, which is hereby incorporated by reference in its entirety for all purposes as if fully set forth herein.

BACKGROUND

Technical Field

The present disclosure relates to a light emitting display device.

Description of the Related Art

Various display devices capable of reducing weight and volume, which are disadvantages of a cathode ray tube, are developed. Such display devices may be implemented as a liquid crystal display (LCD), a field emission display (FED), a plasma display panel (PDP), and an electroluminescence display, etc.

BRIEF SUMMARY

Pi Based on known techniques, it is difficult to make it possible to attain initialization of an anode of a light emitting element and an auxiliary capacitor and compensation for a voltage variation of a power voltage line while maintaining a low number of signals and fixed voltages.

For examples, known techniques require a large number of signals and fixed voltages without compensating for a voltage variation in a low power line, and known techniques also lack voltage compensation for a high power voltage line.

As another example, known techniques lack an initialization of an anode of a light emitting element and a sufficient initialization of an auxiliary capacitor.

The present disclosure provides a light emitting display device that can stably display high quality pictures by solving above technical problems.

Accordingly, the present disclosure is directed to a light emitting display device that can attain initialization of an anode of a light emitting element and an auxiliary capacitor and compensation for a voltage variation of a power voltage line while maintaining a low number of signals and fixed voltages.

Additional features and advantages of the disclosure will be set forth in the description which follows, and in part will be apparent from the description, or may be learned by practice of the disclosure. The advantages of the disclosure will be realized and attained by the structure particularly pointed out in the written description and claims as well as the appended drawings.

To achieve these and other advantages, and in accordance with the purpose of the present disclosure, as embodied and broadly described herein, a light emitting display device, includes: a plurality of pixels arranged in a matrix form, each of the plurality of pixels including: a light emitting element in which a light emitting diode including an anode and a cathode; a light emission transistor, one of a source or a drain of the light emission transistor is connected to the anode; a driving transistor, one of a source or a drain of the driving transistor is connected to the other of the source or the drain of the light emission transistor; and an initialization transistor which is configured to connect a gate of the driving transistor, the one of the source or the drain of the driving transistor, and the anode being connected to an initialization voltage line having a fixed voltage at a same time, wherein initialization transistor has a resistance greater than the driving transistor.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate various embodiments of the disclosure and together with the description serve to explain the principles of the disclosure. In the drawings.

DETAILED DESCRIPTION

Reference will now be made in detail to embodiments, examples of which are illustrated in the accompanying drawings. The same or like reference numbers may be used throughout the drawings to refer to the same or like parts.

Figure 1:
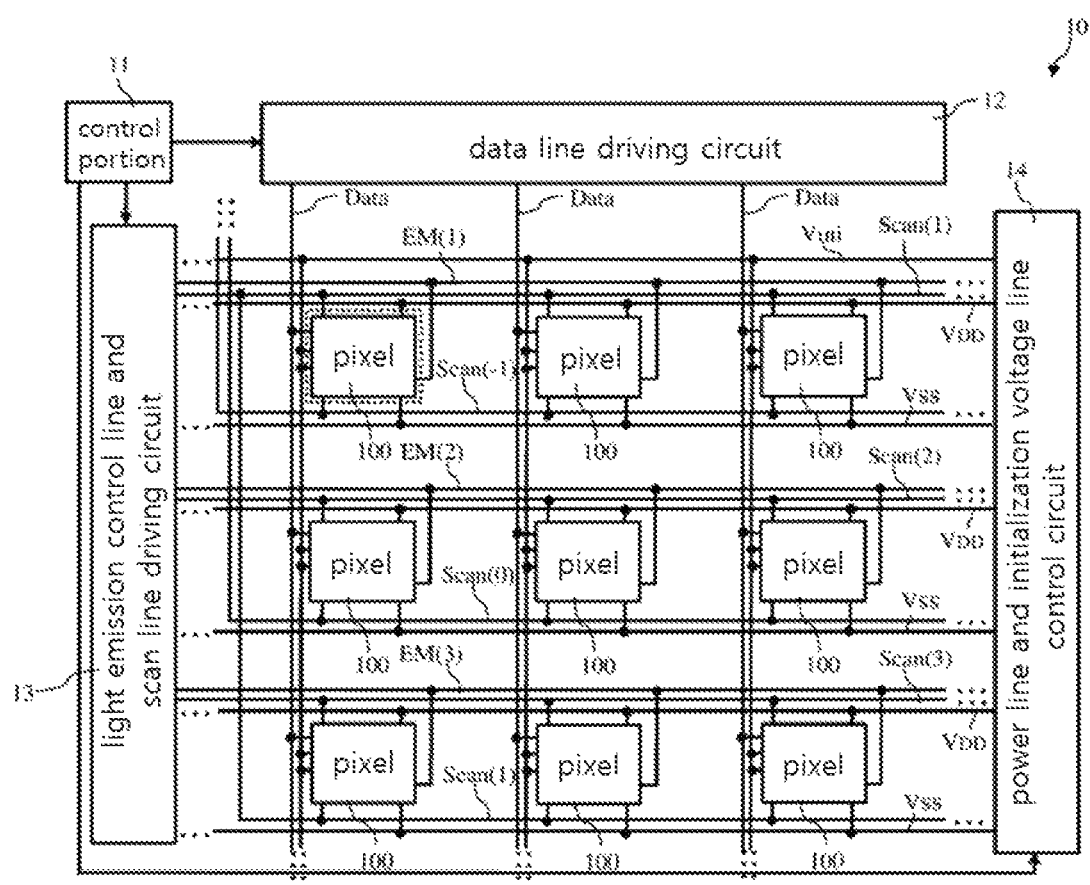
FIG. 1 is a block diagram illustrating an overall configuration of a light emitting display device according to one or more embodiments of the present invention.

FIG. 1 is a block diagram illustrating an overall configuration of a light emitting display device according to one or more embodiments of the present disclosure.

Referring to FIG. 1, the light emitting display device 10 may include a control portion 11, a data line driving circuit 12, a light emission control line and scan line driving circuit 13, a power line and initialization voltage line control circuit 14, and a plurality of pixels 100 arranged in a matrix form.

In FIG. 1, a part of the plurality of pixels 100 is extracted and illustrated in three rows by three columns by way of example. However, in fact, more pixels than those shown in FIG. 1 are arranged.

The control portion 11 may output control signals for controlling the data line driving circuit 12, the light emission control line and scan line driving circuit 13, and the power line and initialization voltage line control circuit 14.

The data line driving circuit 12 may be a driving circuit that outputs data signals to a plurality of data lines Data based on the control signal from the control portion 11.

The light emission control line and scan line driving circuit 13 may be a driving circuit that outputs signals to, drives, a plurality of light emission control lines EM(n) and scan lines Scan(n) connected thereto based on the control signals from the control portion 11.

n is a natural number.

The power line and initialization voltage line control circuit 14 may be a control circuit that controls voltages of a high voltage power line as a power line of a high power voltage VDD, a low voltage power line as a power line of a low power voltage VSS, and an initialization voltage line as a power line of an initialization voltage Vini.

Figure 2A:
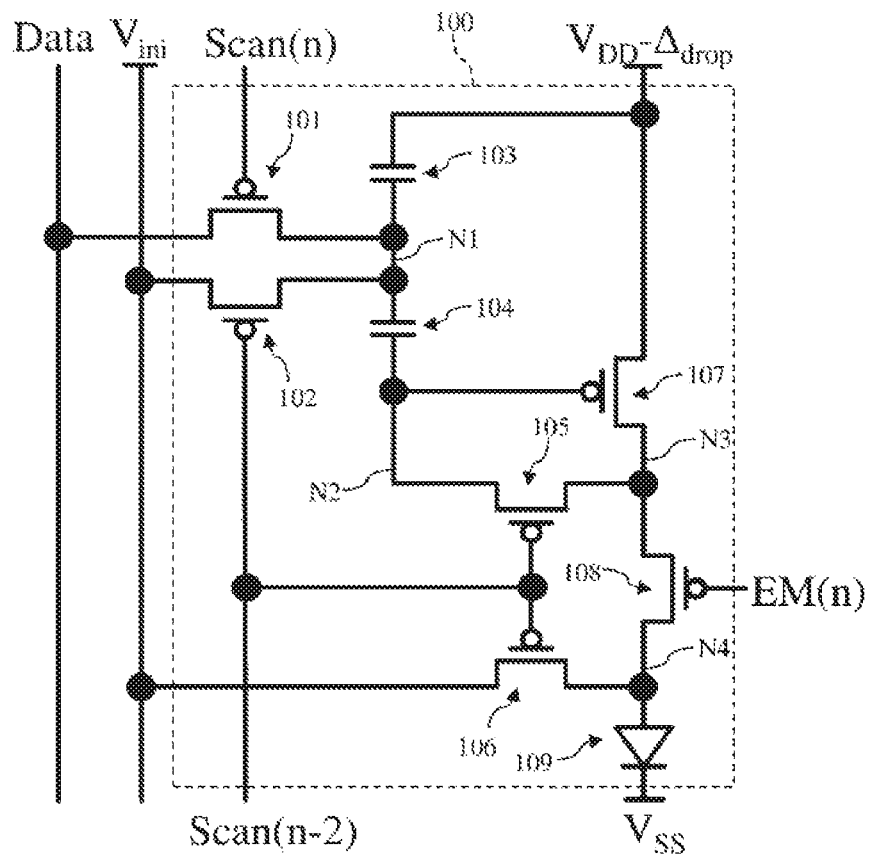
FIG. 2A is a view illustrating a pixel circuit of a pixel surrounded by a broken line shown in FIG. 1.

FIG. 2A is a view illustrating a pixel circuit of a pixel surrounded by a broken line shown in FIG. 1.

In the pixel 100 of FIG. 2A, transistors 101, 102, 105, 106, 107 and 108, which are P-type thin film transistors (TFTs), capacitors 103 and 104, and a light emitting element 109 may be provided.

The transistors applicable to this disclosure are not limited to P-type TFTs, and may use N-type TFTs.

The transistor 106 may be an initialization TFT.

The transistor 107 may be a driving TFT.

The initialization TFT may preferably have a resistance greater than the driving TFT. As described later, the initialization TFT may be prevented from being destroyed by increasing a channel length L thereof and shortening a channel width W thereof.

Specifically, the channel length L of the initialization TFT may be made longer than a channel length L of the driving TFT, and the channel width W of the initialization TFT may be made shorter than a channel width W of the driving TFT.

Moreover, in FIG. 2A, it is shown that the data line Data, the initialization voltage line of the initialization voltage Vini, a $n^{th}$ scan line Scan(n), a $(n-2)^{th}$ scan line Scan(n-2), and a $n^{th}$ light emission control line EM(n), a high voltage power line as a first power line of a power voltage VDD-$\Delta$drop, and a low voltage power line as a second power line of a power voltage VSS.

Moreover, the initialization voltage Vini, the power voltage VDD of the high voltage power line as the first power line, and the power voltage VSS of the low voltage power line as the second power line may be fixed voltages, and the high voltage power line may have a higher voltage than the initialization voltage line, and the low voltage power line may have a lower voltage than the initialization voltage line.

For example, the power voltage VDD of the high voltage power line may be about 3V, the initialization voltage Vini may be about −2V, and the power voltage VSS of the low voltage power line may be about −4V.

Moreover, $\Delta$drop may be a voltage variation value of the high voltage power line.

Moreover, in FIG. 2A, a first node N1, a second node N2, a third node N3 and a fourth node N4 are shown.

The first node N1 may be a node that is connected to one of a source or a drain of the transistor 101, one of a source or a drain of the transistor 102, one electrode of the capacitor 103, and one electrode of the capacitor 104.

The second node N2 may be a node that is connected to the other electrode of the capacitor 104, one of a source or a drain of the transistor 105, and a gate of the transistor 107.

The third node N3 may be a node that is connected to the other of the source or the drain of the transistor 105, one of a source or a drain of the transistor 107, and one of a source or a drain of the transistor 108.

The fourth node N4 may be a node that is connected to one of a source or a drain of the transistor 106, the other of the source or the drain of the transistor 108, and an anode of the light emitting element 109.

A gate of the transistor 101 as a first transistor may be connected to a $n^{th}$ scan line Scan(n), the one of the source or the drain of the transistor 101 may be connected to the first node N1, and the other of the source or the drain of the transistor 101 may be connected to the data line Data.

A gate of the transistor 102 as a second transistor may be connected to a $(n-2)^{th}$ scan line Scan(n-2), the one of the source or the drain of the transistor 102 may be connected to the first node N1, and the other of the source or the drain of the transistor 102 may be connected to the initialization voltage line.

The one electrode of the capacitor 103 as a first capacitor may be connected to the first node N1, and the other electrode of the capacitor 103 may be connected to the high voltage power line.

The one electrode of the capacitor 104 as a second capacitor may be connected to the first node N1, and the other electrode of the capacitor 104 may be connected to the second node N2.

A gate of the transistor 105 as a third transistor may be connected to the $(n-2)^{th}$ scan line Scan(n-2), the one of the source or the drain of the transistor 105 may be connected to the second node N2, and the other of the source or the drain of the transistor 105 may be connected to the third node N3.

A gate of the transistor 106 as a fourth transistor may be connected to the $(n-2)^{th}$ scan line Scan(n-2), the one of the source or the drain of the transistor 106 may be connected to the fourth node N4, and the other of the source or the drain of the transistor 106 may be connected to the initialization voltage line.

The gate of the transistor 107 as a fifth transistor may be connected to the second node N2, the one of source or the drain of the transistor 107 may be connected to the third node N3, and the other of the source or the drain of the transistor 107 may be connected to the high voltage power line.

A gate of the transistor 108 as a sixth transistor may be connected to the $n^{th}$ light emission control line EM(n), the one of source or the drain of the transistor 108 may be connected to the third node N3, and the other of the source or the drain of the transistor 108 may be connected to the fourth node N4.

The anode of the light emitting element 109 may be connected to the fourth node N4, and the cathode of the light emitting element 109 may be connected to the low voltage power line.

Figure 2B:
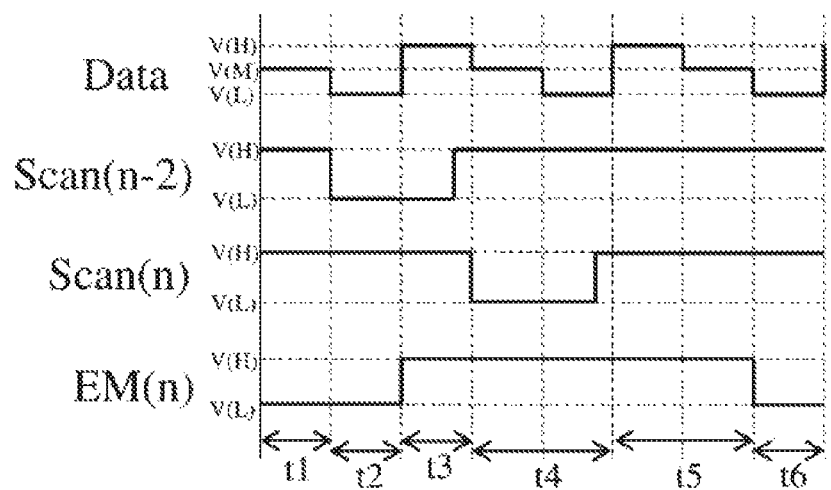
FIG. 2B is a timing chart illustrating an operation of a pixel circuit of a pixel 100 of FIG. 2A.

An operation of a pixel circuit of FIG. 2A is explained below,

FIG. 2B is a timing chart illustrating an operation of a pixel circuit of a pixel 100 of FIG. 2A.

A period t1 is a light emission period of a previous frame, a period t2 is a reset period of the capacitors and the light emitting element, a period t3 is a reset and sensing period of the light emitting element, a period t4 is a writing period, a period t5 is a waiting period, and a period t6 is a light emission period of a current frame.

As shown in FIG. 2B, a voltage of the data line Data may be varied stepwise within a range of V(L) to V(H) depending on an image, and voltages of the $(n-2)^{th}$ scan line Scan(n-2), the $n^{th}$ scan line Scan(n) and the $n^{th}$ light emission control line EM(n) may each be either V(L) or V(H).

In a case of using P-type TFTs, V(L) is an ON signal and V(H) is an OFF signal.

In this case, magnitude relationship between V(L), V(M), and V(H) in each line is V(L)<V(M)<V(H).

In the period t1, for example, the voltage of the data line Data is V(M), the voltage of the $(n-2)^{th}$ scan line Scan(n-2) is V(H), the voltage of the $n^{th}$ scan line Scan(n) is V(H), and the voltage of the $n^{th}$ light emission control line EM(n) is V(L).

In the period t2, the voltage of the data line Data is V(L), the voltage of the $(n-2)^{th}$ scan line Scan(n-2) is V(L), the voltage of the $n^{th}$ scan line Scan(n) is V(H), and the voltage of the $n^{th}$ light emission control line EM(n) is V(L).

By such the voltages applied to the pixel, in the period t2, the transistor 101 is turned off, and the transistors 102, 105, 106, 107 and 108 are turned on.

Accordingly, in the period t2, all of the first node N1, the second node N2, the third node N3, and the fourth node N4 are connected to the initialization voltage line to have the initialization voltage Vini.

At this time, the voltage of the capacitor 103 is V(103)=VDD-Δdrop-Vini.

In the period t3, the voltage of the data line Data is V(H), the voltage of the $(n-2)^{th}$ scan line Scan (n-2) is switched from V(L) to V(H) in a later section of the period t3, the voltage of the $n^{th}$ scan line Scan(n) is V(H), and the voltage of the $n^{th}$ light emission control line EM(n) is V(H).

By such the voltages applied to the pixel, in the period t3, the transistors 101 and 108 are turned off, and the transistors 102, 105 and 106 are turned on.

Further, the transistor 107 is also turned on. Regarding the transistor 107, the third node N3 is charged until the transistor 107 becomes in a state of Vgs=Vth so that no current flows between the source and drain of the transistor 107.

In this regard, Vgs is a gate-to-source voltage based on the source of the transistor 107, and Vth is a threshold voltage of the transistor 107.

Accordingly, in the period t3, the voltage of the capacitor 103 is V(103)=VDD-Δdrop-Vini, and the voltage of the capacitor 104 is V(104)=VDD-Δdrop+Vth-Vini, the voltages of the second node N2 and the third node N3 are VDD-Δdrop+Vth.

In the period t4, the voltage of the data line Data is switched from V(M) to V(L) in a middle of the period t4, and the voltage of the $(n-2)^{th}$ scan line Scan (n-2) is V(H). The voltage of the $n^{th}$ scan line Scan(n) is switched from V(L) to V(H) in a later section of the period, and the voltage of the $n^{th}$ light emission control line EM(n) is V(H).

By such the voltages applied to the pixel, in the period t4, the transistors 102, 105, 106, 107 and 108 are turned off, and the transistor 101 is turned on.

In the period t4, the voltage of the first node N1 becomes the voltage Vdata of the data line Data, the voltage of the capacitor 103 becomes V(103)=Vdata-(VDD-Δdrop), and the voltage of the capacitor 104 is V(104)=VDD-Δdrop Vth-Vini, the voltage of the second node N2 is Vdata+V(104)=Vdata+VDD-Δdrop Vth-Vini.

In the period t5, the voltage of the data line Data is switched from V(H) to V(M) in a middle of the period t5, and the voltage of the $(n-2)^{th}$ scan line Scan (n-2) is V(H). The voltage of the $n^{th}$ scan line Scan(n) is V(H), and the voltage of the $n^{th}$ light emission control line EM(n) is V(H).

By such the voltages applied to the pixel, in the period t5, the transistors 101, 102, 105, 106, 107 and 108 are turned off.

In the period t6, the voltage of the data line Data is V(L), the voltage of the $(n-2)^{th}$ scan line Scan (n-2) is V(H), the voltage of the $n^{th}$ scan line Scan(n) is V(H), and the voltage of the $n^{th}$ light emission control line EM(n) is V(L).

By such the voltages applied to the pixel, in the period t6, the transistors 101, 102, 105 and 106 are turned off, and the transistors 107 and 108 are turned on.

Accordingly, the accumulated charge flows to the anode of the light emitting element 109 through the third node N3 and the fourth node N4, and the light emitting element 109 emits a light.

At this time, in the transistor 107 as a driving transistor, Vgs=Vdata+Vth-Vini.

As such, since the voltage variation of the voltage power line is not included in the gate-to-source voltage of the driving transistor during the light emission, the voltage variation of the power voltage line may be compensated.

Moreover, as described above, the signals used in one or more embodiments are the signal of the data line, the signal of the scan line, and the signal of the emission control line. The fixed voltages used in one or more embodiments are the initialization voltage Vini, the power voltage VDD of the high voltage power line, and the power voltage. VSS of the low voltage power line. As a result, a low number of the signals and a low number of the fixed voltages are maintained.

Therefore, compared with the related art, a light emitting display device capable of performing initialization of the anode of the light emitting element and the auxiliary capacitor and compensating for the voltage variation of the power voltage line while maintaining a low number of the signals and the fixed voltages may be obtained.

Accordingly, a light emitting display device capable of stably displaying with high quality may be obtained.

The transistors applied in one or more embodiments are explained below.

Figure 3A:
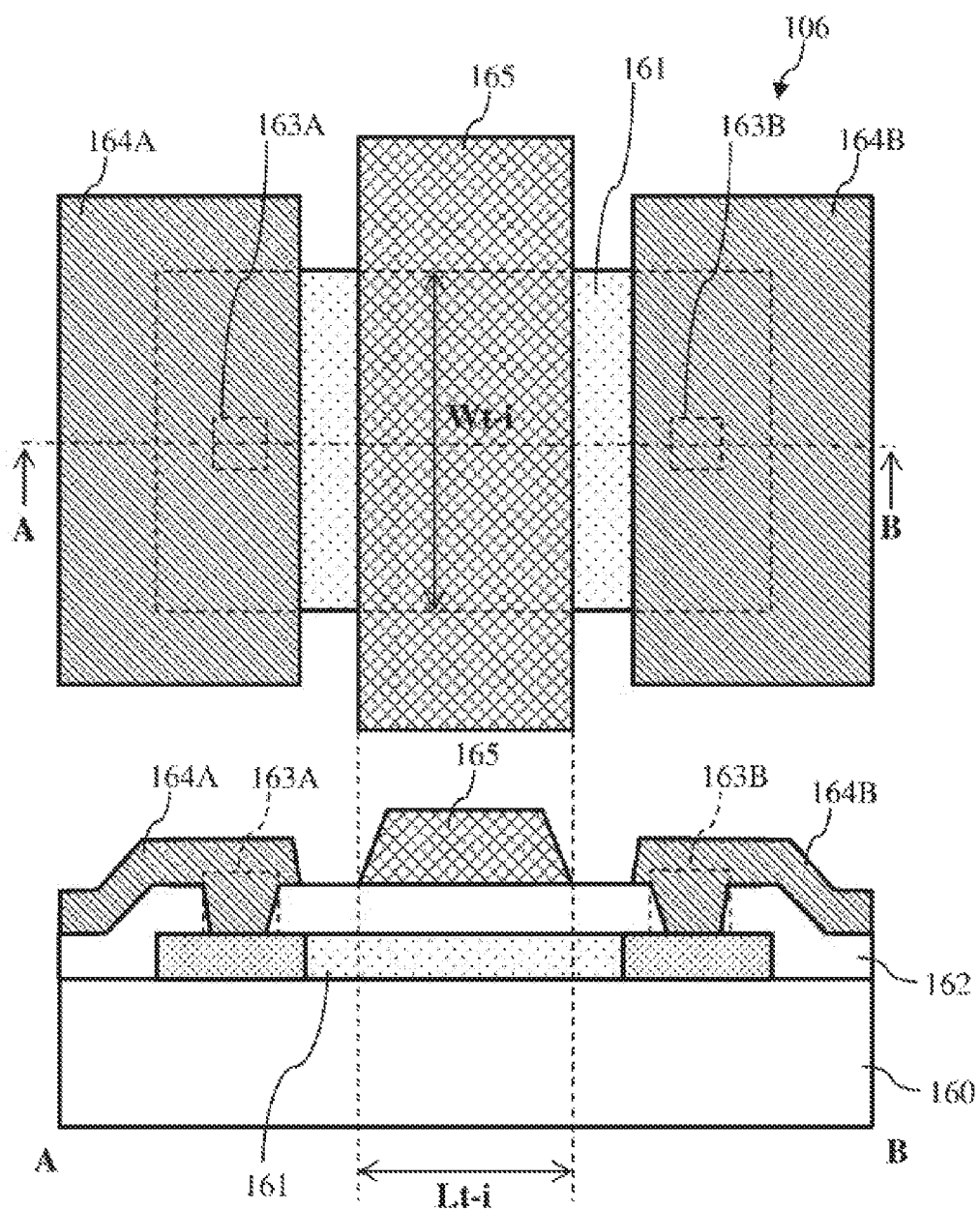
FIG. 3A is a top view and a cross-sectional view of an initialization transistor of FIG. 2A.

FIG. 3A is a top view and a cross-sectional view of the transistor as the initialization transistor of FIG. 2A.

The transistor 106 of FIG. A may have a coplanar top gate structure.

As shown in FIG. 3A, a semiconductor layer 161 may be provided on a substrate 160, an insulating layer 162 may be provided while covering the semiconductor layer 161. The first electrode layers 164A and 164B may be provided to be connected to the semiconductor layer 161 through openings 164A and 164b provided in the insulating layer 162, and a second electrode layer 165 may be provided on the insulating layer 162 and at a position overlapping the semiconductor layer 161.

Moreover, as shown in FIG. 3A, the transistor 106 as the initialization transistor may have a shape such that a channel length Lt-i is shorter than a channel width Wt-i.

The substrate 160 may be an insulating substrate.

As an insulating substrate, a glass substrate may be used by way of example.

The semiconductor layer 161 may be formed of polycrystalline silicon or oxide semiconductor.

As polycrystalline silicon, low temperature polysilicon (LTPS) formed by laser-crystallizing amorphous silicon may be used by way of example.

An oxide semiconductor may use, for example, but not limited to, indium gallium zinc oxide (IGZO).

In the semiconductor layer 161, a channel conducting portion may be provided at a portion in contact with the source and drain, and a contact resistance may be reduced.

The insulating layer 162 may be a gate insulating layer and may be formed of silicon oxide or silicon nitride.

The insulating layer 162 may be formed by a chemical vapor deposition (CVD) method.

The openings 163A and 163B may be formed by, for example, selectively etching parts of the insulating layer 162.

The etching may be preferably performed by dry etching.

The first electrode layers 164A and 164B may form source and drain electrodes.

The first electrode layers 164A and 164B may be formed by, for example, selectively etching parts of a metal film which is formed through a sputtering method.

The second electrode layer 165 may form a gate electrode.

The second electrode layer 165 may be formed by the same method as the first electrode layers 164A and 164B.

Although not shown in the drawings, an insulating layer may be provided between the first electrode layers 164A and 164B and the second electrode layer 165 to ensure insulation between the gate and the source and drain.

Figure 3B:
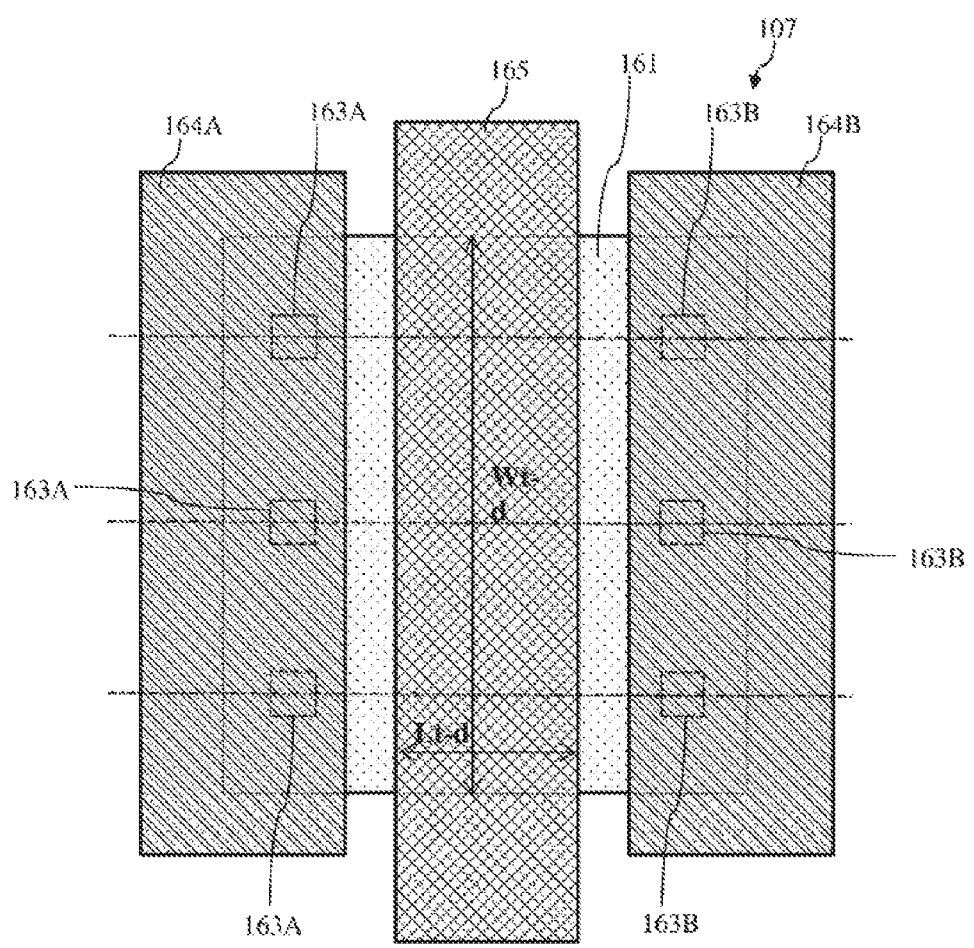
FIG. 3B is a top view of a driving transistor of FIG. 2A.

FIG. 3B is a top view of the transistor as the driving transistor of FIG. 2A.

In FIG. 3B, a number of opening 163A and a number of opening 163B may each be, but not limited to, plural number.

The channel length Lt-i of the transistor 106 as the initialization transistor may be longer than a channel length Lt-d of the transistor 107 as the driving transistor, and the channel width Wt-i of the transistor 106 as the initialization transistor may be shorter than a channel width Wt-d of the transistor 107 as the driving transistor.

Moreover, a ratio of the width to the length of the current direction in a channel layer of the transistor 106 as the initialization transistor may be smaller than that in a channel layer of the transistor 107 as the driving transistor, that is, Wt-i/Lt-i<Wt-d/Lt-d.

With such the structure, a resistance of the transistor 106 as the initialization transistor may be greater than a resistance of the transistor 107 as the driving transistor.

However, the transistor 106 may be not limited to that shown in FIGS. 3A and 3B.

Figure 4A:
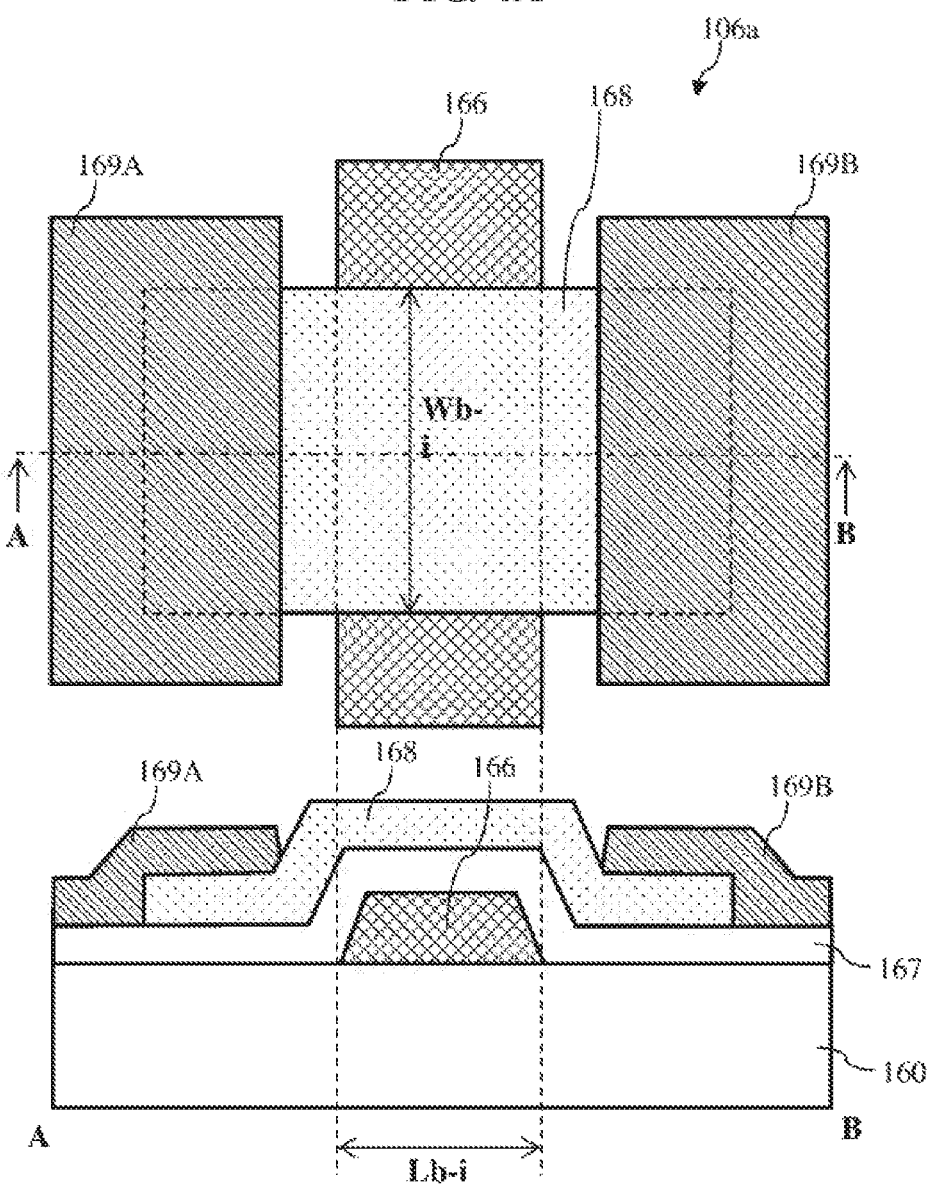
FIG. 4A is a top view and a cross-sectional view of a transistor as a modification of an initialization transistor of FIG. 2A.

FIG. 4A is a top view and a cross-sectional view of a transistor 106a which is a modification of the transistor 106 of FIG. 2A.

The transistor of FIG. 4A may have an inverted staggered bottom gate structure.

A first electrode layer 166 may correspond to the second electrode layer 165 of FIG. 3A and may form a gate electrode.

An insulating layer 167 may correspond to the insulating layer 162 of FIG. 3A and may form a gate insulating layer.

A semiconductor layer 168 may correspond to the semiconductor layer 161 of FIG. 3A.

Second electrode layers 169A and 169B may correspond to the first electrode layers 164A and 164B of FIG. 3A and may form source and drain electrodes.

As shown in FIG. 4A, the transistor 106a as the initialization transistor may have a shape such that a channel length Lb-i is shorter than a channel width Wb-i.

Figure 4B:
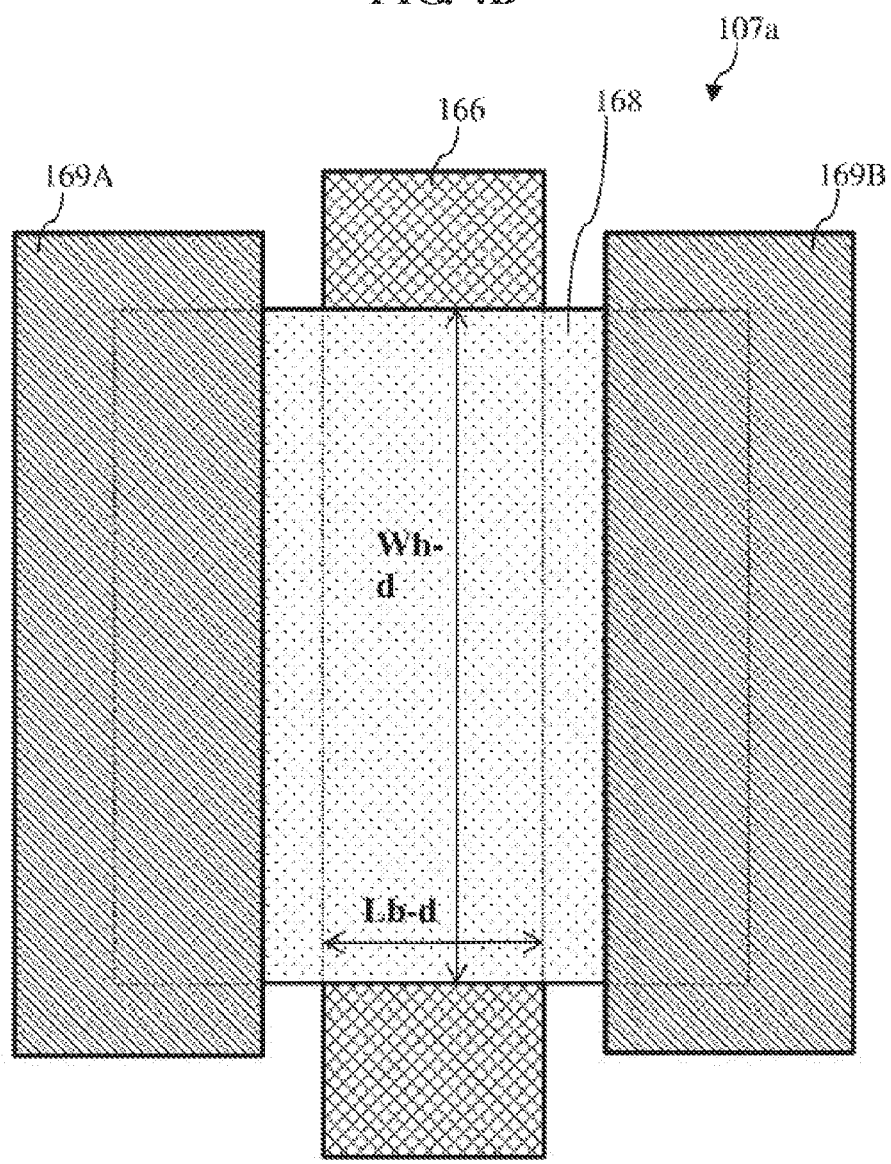
FIG. 4B is a top view of a transistor as a modification of a driving transistor of FIG. 2A.

FIG. 4B is a top view of a transistor 107a which is a modification of the transistor 107 of FIG. 2A.

As shown in FIGS. 4A and 4B, the bottom gate structure may also have the same length relationship as the above-described top gate structure.

In other words, the channel length Lb-i of the transistor 106a as the initialization transistor may be longer than the channel length Lb-d of the transistor 107a as the driving transistor, and the channel width Wb-i of the transistor 106a as the initialization transistor may be shorter than the channel width Wb-d of the transistor 107a as the driving transistor.

Moreover, a ratio of the width to the length of the current direction in a channel layer of the transistor 106a as the initialization transistor may be smaller than that in a channel layer of the transistor 107a as the driving transistor, that is, Wb-i J Lb-i<Wb-d Lb-d.

With such the structure, a resistance of the transistor 106a as the initialization transistor may be greater than a resistance of the transistor 107a as the driving transistor.

As described above, in one or more embodiments, a light emitting display device may be capable of performing initialization of an anode of a light emitting element and an auxiliary capacitor and compensating for voltage variation of a power voltage line while maintaining a low number of signals and fixed voltages, compared with the related art.

Figure 5:
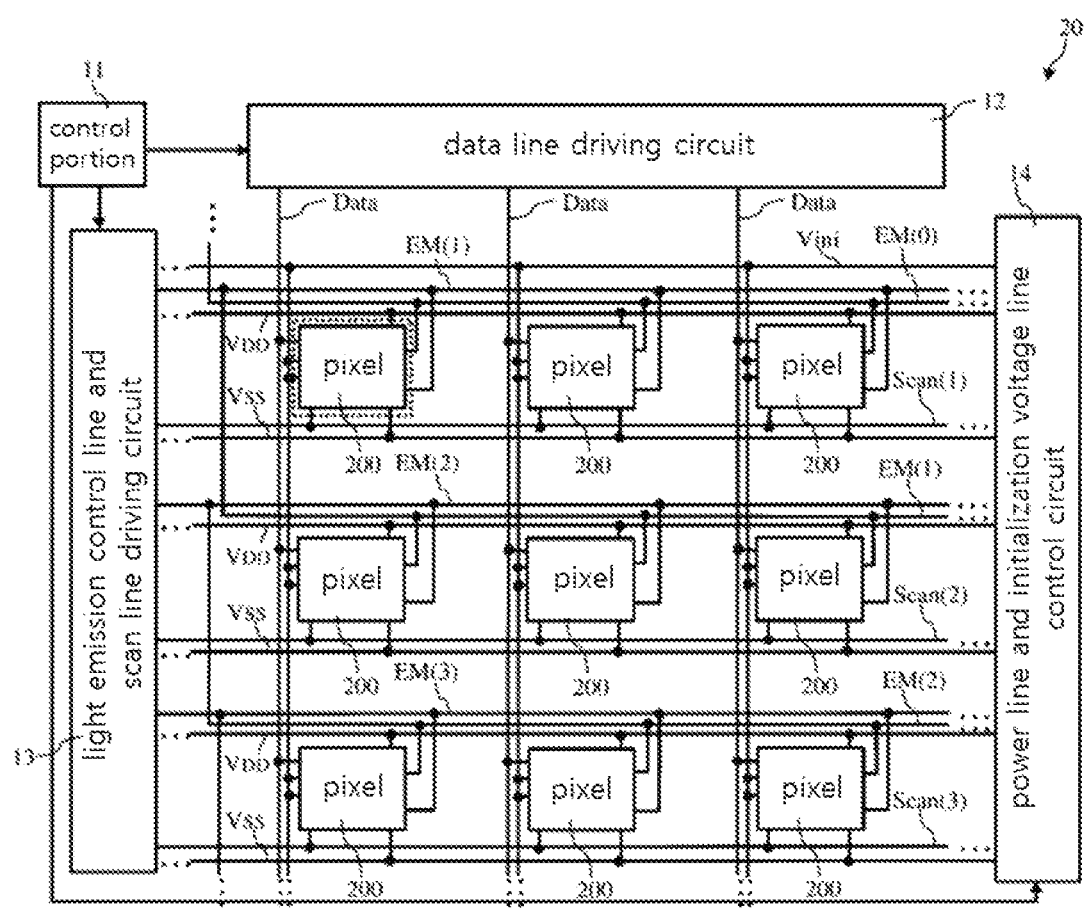
FIG. 5 is a block diagram illustrating an overall configuration of a light emitting display device according to one or more embodiments of the present invention.

FIG. 5 is a block diagram illustrating an overall configuration of a light emitting display device according to one or more embodiments of the present disclosure.

Referring to FIG. 5, the light emitting display device 20 may include a control portion 11, a data line driving circuit 12, a light emission control line and scan line driving circuit 13, a power line and initialization voltage line control circuit 14, and a plurality of pixels 200 arranged in a matrix form.

In FIG. 5, a part of the plurality of pixels 200 is extracted and illustrated in three rows by three columns by way of example. However, in fact, more pixels than those shown in FIG. 5 are arranged.

The control portion 11 may output control signals for controlling the data line driving circuit 12, the light emission control line and scan line driving circuit 13, and the power line and initialization voltage line control circuit 14.

The data line driving circuit 12 may be a driving circuit that outputs data signals to a plurality of data lines Data based on the control signal from the control portion 11.

The light emission control line and scan line driving circuit 13 may be a driving circuit that outputs signals to, drives, a plurality of light emission control lines EM(n) and scan lines Scan(n) connected thereto based on the control signals from the control portion 11.

n is a natural number.

The power line and initialization voltage line control circuit 14 may be a control circuit that controls voltages of a high voltage power line as a power line of a high power voltage VDD, a low voltage power line as a power line of a low power voltage VSS, and an initialization voltage line as a power line of an initialization voltage Vini.

Figure 6A:
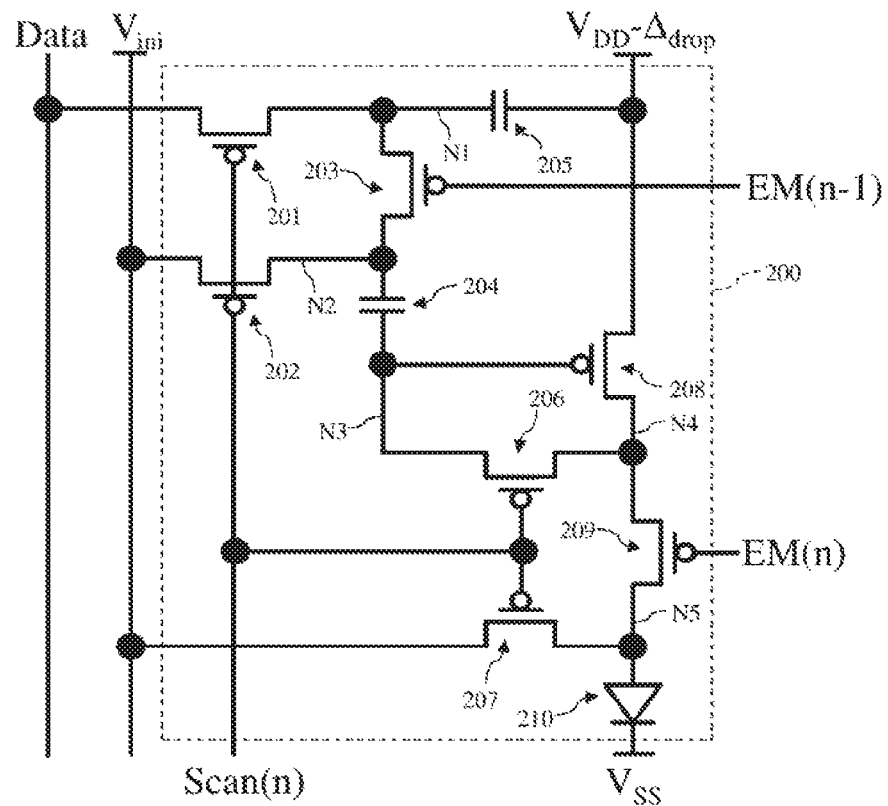
FIG. 6A is a view illustrating a pixel circuit of a pixel surrounded by a broken line shown in FIG. 5.

FIG. 6A is a view illustrating a pixel circuit of a pixel surrounded by a broken line shown in FIG. 5.

In the pixel 200 of FIG. 6A, transistors 201, 202, 203, 206, 207, 208 and 209, which are P-type thin film transistors (TFTs), capacitors 204 and 205, and a light emitting element 210 may be provided.

The transistors applicable to this disclosure are not limited to P-type TFTs, and may use N-type TFTs.

The transistor 207 may be an initialization TFT.

The transistor 208 may be a driving TFT.

In one or more embodiments, as described above, the initialization TFT may preferably have a resistance greater than the driving TFT. Specifically, a channel length L of the initialization TFT may be made longer than a channel length L of the driving TFT, and a channel width W of the initialization TFT may be made shorter than a channel width W of the driving TFT, and thus the initialization TFT may be prevented from being destroyed.

Moreover, in FIG. 6A, it is shown that the data line Data, the initialization voltage line of the initialization voltage Vini, a $n^{th}$ scan line Scan(n), a $(n-1)^{th}$ light emission control line EM(n−1) as a first light emission control line, a $n^{th}$ light emission control line EM(n) which is a second light emission control line at one row line after the first light emission control line, a high voltage power line as a first power line of a high power voltage VDD−Δdrop, and a low voltage power line as a second power line of a low power voltage VSS.

Moreover, as described above, the initialization voltage Vini, the power voltage VDD of the high voltage power line as the first power line, and the power voltage VSS of the low voltage power line as the second power line may be fixed voltages, and the high voltage power line may have a higher voltage than the initialization voltage line, and the low voltage power line may have a lower voltage than the initialization voltage line.

For example, the power voltage VDD of the high voltage power line may be about 3V, the initialization voltage Vini may be about −2V, and the power voltage VSS of the low voltage power line may be about −4V.

Moreover, Δdrop may be a voltage variation value of the high voltage power line.

Moreover, in FIG. 6A, a first node N1, a second node N2, a third node N3, a fourth node N4 and a fifth node N5 are shown.

The first node N1 may be a node that is connected to one of a source or a drain of the transistor 201, one of a source or a drain of the transistor 203 and one electrode of the capacitor 205.

The second node N2 may be a node that is connected to the other of the source or the drain of the transistor 203, one of a source or a drain of the transistor 202 and one electrode of the capacitor 204.

The third node N3 may be a node that is connected to the other electrode of the capacitor 204, one of a source or a drain of the transistor 206 and a gate of the transistor 208.

The fourth node N4 may be a node that is connected to the other of the source or the drain of the transistor 206, one of a source or a drain of the transistor 208, and one of a source or a drain of the transistor 209.

The fifth node N5 may be a node that is connected to the other of the source or the drain of the transistor 209, one of a source or a drain of the transistor 207, and an anode of the light emitting element 210.

A gate of the transistor 201 as a first transistor may be connected to a $n^{th}$ scan line Scan(n), the one of the source or the drain of the transistor 201 may be connected to the first node N1, and the other of the source or the drain of the transistor 201 may be connected to the data line Data.

A gate of the transistor 202 as a second transistor may be connected to a $n^{th}$ scan line Scan(n), the one of the source or the drain of the transistor 202 may be connected to the second node N2, and the other of the source or the drain of the transistor 202 may be connected to the initialization voltage line.

A gate of the transistor 203 as a third transistor may be connected to a $(n-1)^{th}$ light emission control line EM(n−1), the one of the source or the drain of the transistor 203 may be connected to the first node N1, and the other of the source or the drain of the transistor 203 may be connected to the second node N2.

The one electrode of the capacitor 204 as a first capacitor may be connected to the second node N2, and the other electrode of the capacitor 204 may be connected to the third node N3.

The one electrode of the capacitor 205 as a second capacitor may be connected to the first node N1, and the other electrode of the capacitor 205 may be connected to the high voltage power line.

A gate of the transistor 206 as a fourth transistor may be connected to the $n^{th}$ scan line Scan(n), the one of the source or the drain of the transistor 206 may be connected to the third node N3, and the other of the source or the drain of the transistor 206 may be connected to the fourth node N4.

A gate of the transistor 207 as a fifth transistor may be connected to the $n^{th}$ scan line Scan(n), the one of source or the drain of the transistor 207 may be connected to the fifth node N5, and the other of the source or the drain of the transistor 207 may be connected to the initialization voltage line.

The gate of the transistor 208 as a sixth transistor may be connected to the third node N3, the one of the source or the drain of the transistor 208 may be connected to the fourth node N4, and the other of the source or the drain of the transistor 208 may be connected to the high voltage power line.

A gate of the transistor 209 as a seventh transistor may be connected to the $n^{th}$ light emission control line EM(n), the one of the source or the drain of the transistor 209 may be connected to the fourth node N4, and the other of the source or the drain of the transistor 209 may be connected to the fifth node N5.

The anode of the light emitting element 210 may be connected to the fifth node N5, and the cathode of the light emitting element 210 may be connected to the low voltage power line.

Figure 6B:
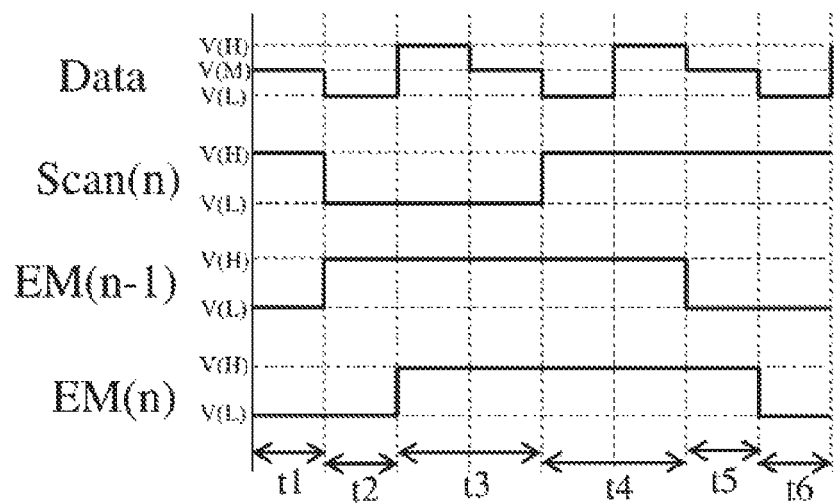
FIG. 6B is a timing chart illustrating an operation of a pixel circuit of a pixel 100 of FIG. 6A.

An operation of a pixel circuit of FIG. 6A is explained below,

FIG. 6B is a timing chart illustrating an operation of a pixel circuit of a pixel 200 of FIG. 6A.

A period t1 is a light emission period of a previous frame, a period t2 is a reset period of the capacitors and the light emitting element, a period t3 is a reset and sensing of the light emitting element and a writing period, a period t4 is a waiting period, a period t5 is a capacitive connection period, and a period t6 is a light emission period of a current frame.

As shown in FIG. 6B, a voltage of the data line Data may be varied stepwise within a range of V(L) to V(H) depending on an image, and voltages of the $n^{th}$ scan line Scan(n), the $(n-1)^{th}$ light emission control line EM(n−1) and the $n^{th}$ light emission control line EM(n) may each be either V(L) or V(H).

In a case of using P-type TFTs, V(L) is an ON signal and V(H) is an OFF signal.

In this case, magnitude relationship between V(L), V(M), and V(H) in each line is V(L)<V(M)<V(H).

In the period t1, for example, the voltage of the data line Data is V(M), the voltage of the $n^{th}$ scan line Scan(n) is V(H), the voltage of the $(n-1)^h$ light emission control line EM(n−1) is V(L), and the voltage of the $n^{th}$ light emission control line EM(n) is V(L).

In the period t2, the voltage of the data line Data is V(L), the voltage of the $n^{th}$ scan line Scan(n) is V(L), the voltage of the $(n-1)^{th}$ light emission control line EM(n−1) is V(H), and the voltage of the $n^{th}$ light emission control line EM(n) is V(L).

By such the voltages applied to the pixel, in the period t2, the transistor 203 is turned off, and the transistors 201, 202, 206, 207, 208 and 209 are turned on.

Accordingly, in the period t2, the second node N2, the third node N3, the fourth node N4 and the fifth node N5 are connected to the initialization voltage line to have the initialization voltage Vini.

In the period t3, the voltage of the data line Data is switched from V(H) to V(M) in a middle of the period t3, the voltage of the $n^{th}$ scan line Scan (n) is V(L), the voltage of the $(n-1)^{th}$ light emission control line EM(n-1) is V(H), and the voltage of the $n^{th}$ light emission control line EM(n) is V(H).

By such the voltages applied to the pixel, in the period t3, the transistor 209 is turned off, and the transistors 201, 202, 203, 206 and 207 are turned on.

Further, the transistor 208 is also turned on. Regarding the transistor 208, the fourth node N4 is charged until the transistor 208 becomes in a state of Vgs=Vth so that no current flows between the source and drain of the transistor 208.

In this regard, Vgs is a gate-to-source voltage based on the source of the transistor 208, and Vth is a threshold voltage of the transistor 208.

Accordingly, in the period t3, the voltage of the first node N7 is the voltage Vdata of the data line Data, the voltage of the fourth node N4 is VDD−Δdrop+Vth, the voltage of the capacitor 204 is V(204)=VDD−Δdrop+Vth−Vini, and the voltage of the capacitor 205 is V(205) Vdata−(VDD−Δdrop).

In the period t4, the voltage of the data line Data is switched from V(L) to V(H) in a middle of the period t4, and the voltage of the $n^{th}$ scan line Scan (n) is V(H). The voltage of the $(n-1)^{th}$ light emission control line EM(n-1) is V(H), and the voltage of the $n^{th}$ light emission control line EM(n) is V(H).

By such the voltages applied to the pixel, in the period t4, the transistors 201, 202, 203, 206, 207, 208 and 209 are turned off.

In the period t4, the voltage of the capacitor 204 is V(204)=VDD−Δdrop+Vth−Vini, and the voltage of the capacitor 205 is V(205)=Vdata (VDD Δdrop).

In the period t5, the voltage of the data line Data is V(M), and the voltage of the $n^{th}$ scan line Scan (n) is V(H). The voltage of the $(n-1)^{th}$ light emission control line EM(n-1) is V(L), and the voltage of the $n^{th}$ light emission control line EM(n) is V(H).

By such the voltages applied to the pixel, in the period t5, the transistors 201, 202, 206, 207, 208 and 209 are turned off, and the transistor 203 is turned on.

Accordingly, in the period t5, the first node N1 and the second node N2 are connected to each other so that one electrode of the capacitor 204 and one electrode of the capacitor 205 are connected to each other.

In the period t6, the voltage of the data line Data is V(L), the voltage of the $n^{th}$ scan line Scan (n) is V(H), the voltage of the $(n-1)^{th}$ light emission control line EM(n-1) is V(L), and the voltage of the $n^{th}$ light emission control line EM(n) is V(L).

By such the voltages applied to the pixel, in the period t6, the transistors 201, 202, 206, 207 and 208 are turned off, and the transistors 203 and 209 are turned on.

Accordingly, the accumulated charge flows to the anode of the light emitting element 210 through the fourth node N4 and the fifth node N5, and the light emitting element 210 emits a light.

At this time, in the transistor 208 as a driving transistor, Vgs=Vdata+Vth−Vini.

As such, since the voltage variation of the voltage power line is not included in the gate-to-source voltage of the driving transistor during the light emission, the voltage variation of the power voltage line may be compensated.

Moreover, as described above, the signals used in one or more embodiments are the signal of the data line, the signal of the scan line, and the signal of the emission control line. The fixed voltages used in one or more embodiments are the initialization voltage Vini, the power voltage VDD of the high voltage power line, and the power voltage VSS of the low voltage power line. As a result, a low number of the signals and a low number of the fixed voltages are maintained.

Therefore, compared with the related art, a light emitting display device capable of performing initialization of the anode of the light emitting element and the auxiliary capacitor and compensating for the voltage variation of the power voltage line while maintaining a low number of the signals and the fixed voltages may be obtained.

Accordingly, a light emitting display device capable of stably displaying with high quality may be obtained.

As described above, in one or more embodiments, a light emitting display device may be capable of performing initialization of an anode of a light emitting element and an auxiliary capacitor and compensating for voltage variation of a power voltage line while maintaining a low number of signals and fixed voltages, compared with the related art.

In the overall configuration of the light emitting display device according to one or more embodiments, pixels 300 may replace the pixels 200 in FIG. 5 of one or more embodiments.

Figure 7A:
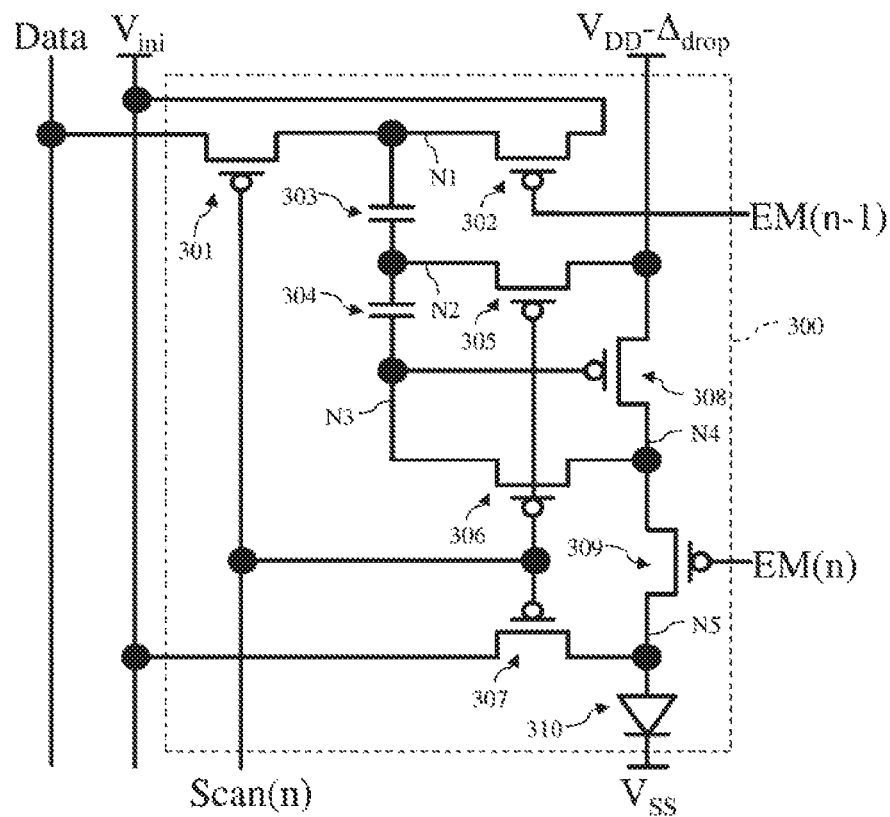
FIG. 7A is a view illustrating a pixel circuit of a pixel of a light emitting display device according to one or more embodiments of the present invention.

FIG. 7A is a view illustrating a pixel circuit of a pixel of a light emitting display device according to one or more embodiments of the present disclosure.

In the pixel 200 of FIG. 7A, transistors 301, 302, 305, 306, 307, 308 and 309, which are P-type thin film transistors (TFTs), capacitors 303 and 304, and a light emitting element 310 may be provided.

The transistors applicable to this disclosure are not limited to P-type TFTs, and may use N-type TFTs.

The transistor 307 may be an initialization TFT.

The transistor 308 may be a driving TFT.

In one or more embodiments, as described above, the initialization TFT may preferably have a resistance greater than the driving TFT. Specifically, a channel length L of the initialization TFT may be made longer than a channel length L of the driving TFT, and a channel width W of the initialization TFT may be made shorter than a channel width W of the driving TFT, and thus the initialization TFT may be prevented from being destroyed.

Moreover, in FIG. 7A, it is shown that the data line Data, the initialization voltage line of the initialization voltage Vini, a $n^{th}$ scan line Scan(n), a $(n-1)^{th}$ light emission control line EM(n-1) as a first light emission control line, a $n^{th}$ light emission control line EM(n) as a second light emission control line, a high voltage power line as a first power line of a high power voltage VDD−Δdrop, and a low voltage power line as a second power line of a low power voltage VSS.

Moreover, as described above, the initialization voltage Vini, the power voltage VDD of the high voltage power line as the first power line, and the power voltage VSS of the low voltage power line as the second power line may be fixed voltages, and the high voltage power line may have a higher voltage than the initialization voltage line, and the low voltage power line may have a lower voltage than the initialization voltage line.

For example, the power voltage VDD of the high voltage power line may be about 3V, the initialization voltage Vini may be about −2V, and the power voltage VSS of the low voltage power line may be about −4V.

Moreover, Δdrop may be a voltage variation value of the high voltage power line.

Moreover, in FIG. 7A, a first node N1, a second node N2, a third node N3, a fourth node N4 and a fifth node N5 are shown.

The first node N1 may be a node that is connected to one of a source or a drain of the transistor 301, one of a source or a drain of the transistor 302 and one electrode of the capacitor 303.

The second node N2 may be a node that is connected to the other electrode of the capacitor 303, one electrode of the capacitor 304, and one of a source or a drain of the transistor 305.

The third node N3 may be a node that is connected to the other electrode of the capacitor 304, one of a source or a drain of the transistor 306 and a gate of the transistor 308.

The fourth node N4 may be a node that is connected to the other of the source or the drain of the transistor 306, one of a source or a drain of the transistor 308, and one of a source or a drain of the transistor 309.

The fifth node N5 may be a node that is connected to one of a source or a drain of the transistor 307, the other of the source or the drain of the transistor 309, and an anode of the light emitting element 310.

A gate of the transistor 301 as a first transistor may be connected to $n^{th}$ scan line Scan(n), the one of the source or the drain of the transistor 301 may be connected to the first node N1, and the other of the source or the drain of the transistor 301 may be connected to the data line Data.

A gate of the transistor 302 as a second transistor may be connected to a $(n-1)^{th}$ light emission control line EM(n−1), the one of the source or the drain of the transistor 302 may be connected to the first node N1, and the other of the source or the drain of the transistor 302 may be connected to the initialization voltage line.

The one electrode of the capacitor 303 as a first capacitor may be connected to the first node N1, and the other electrode of the capacitor 303 may be connected to the second node N2.

The one electrode of the capacitor 304 as a second capacitor may be connected to the second node N2, and the other electrode of the capacitor 304 may be connected to the third node N3.

A gate of the transistor 305 as a third transistor may be connected to a $n^{th}$ scan line Scan(n), the one of the source or the drain of the transistor 305 may be connected to the second node. N2, and the other of the source or the drain of the transistor 305 may be connected to the high voltage power line.

A gate of the transistor 306 as a fourth transistor may be connected to the $n^{th}$ scan line Scan(n), the one of the source or the drain of the transistor 306 may be connected to the third node N3, and the other of the source or the drain of the transistor 306 may be connected to the fourth node N4.

A gate of the transistor 307 as a fifth transistor may be connected to the $n^{th}$ scan line Scan(n), the one of source or the drain of the transistor 307 may be connected to the fifth node N5, and the other of the source or the drain of the transistor 207 may be connected to the initialization voltage line.

The gate of the transistor 308 as a sixth transistor may be connected to the third node N3, the one of source or the drain of the transistor 308 may be connected to the fourth node N4, and the other of the source or the drain of the transistor 308 may be connected to the high voltage power line.

A gate of the transistor 309 as a seventh transistor may be connected to the $n^{th}$ light emission control line EM(n), the one of the source or the drain of the transistor 309 may be connected to the fourth node N4, and the other of the source or the drain of the transistor 309 may be connected to the fifth node N5.

The anode of the light emitting element 310 may be connected to the fifth node N5, and the cathode of the light emitting element 310 may be connected to the low voltage power line.

Figure 7B:
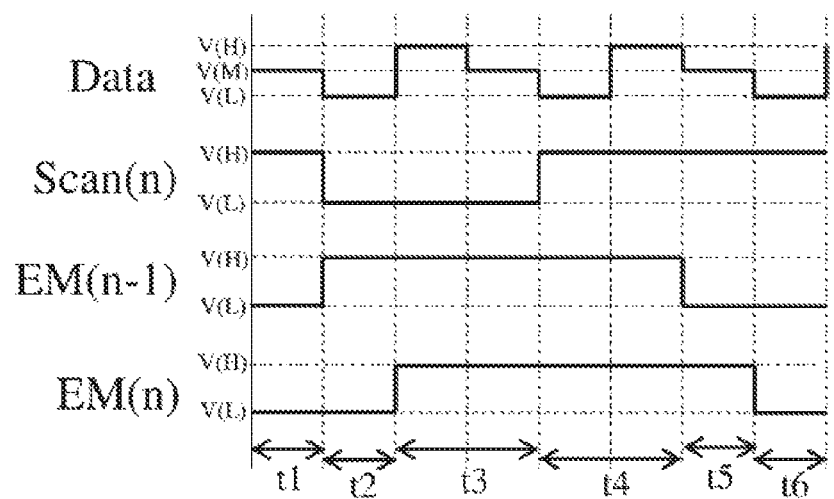
FIG. 7B is a timing chart illustrating an operation of a pixel circuit of a pixel 100 of FIG. 7A.

An operation of a pixel circuit of FIG. 7A is explained below,

FIG. 7B is a timing chart illustrating an operation of a pixel circuit of a pixel 300 of FIG. 7A.

A period t1 is a light emission period of a previous frame, a period t2 is a reset period of the capacitors and the light emitting element, a period t3 is a reset and sensing of the light emitting element and a writing period, a period t4 is a waiting period, a period t5 is a capacitive connection period, and a period t6 is a light emission period of a current frame.

As shown in FIG. 7B, a voltage of the data line Data may be varied stepwise within a range of V(L) to V(H) depending on an image, and voltages of the $n^{th}$ scan line Scan(n), the $(n-1)^{th}$ light emission control line EM(n−1) and the $n^{th}$ light emission control line. EM(n) may each be either V(L) or V(H).

In a case of using P-type TFTs, V(L) is an ON signal and V(H) is an OFF signal.

In this case, magnitude relationship between V(L), V(M), and V(H) in each line is V(L)<V(M)<V(H).

In the period t1, for example, the voltage of the data line Data is V(M), the voltage of the $n^{th}$ scan line Scan(n) is V(H), the voltage of the $(n-1)^{th}$ light emission control line EM(n−1) is V(L), and the voltage of the $n^{th}$ light emission control line EM(n) is V(L).

In the period t2, the voltage of the data line Data is V(L), the voltage of the $n^{th}$ scan line Scan(n) is V(L), the voltage of the $(n-1)^{th}$ light emission control line EM(n−1) is V(H), and the voltage of the $n^{th}$ light emission control line EM(n) is V(L).

By such the voltages applied to the pixel, in the period t2, the transistor 302 is turned off, and the transistors 301, 305, 306, 307, 308 and 309 are turned on.

Accordingly, in the period t2, the third node N3, the fourth node N4 and the fifth node N5 are connected to the initialization voltage line to have the initialization voltage Vini.

In the period t3, the voltage of the data line Data is switched from V(H) to V(M) in a middle of the period t3, the voltage of the $n^{th}$ scan line Scan (n) is V(L), the voltage of the $(n-1)^{th}$ light emission control line EM(n−1) is V(H), and the voltage of the $n^{th}$ light emission control line EM(n) is V(H).

By such the voltages applied to the pixel, in the period t3, the transistor 302 and 309 are turned off, and the transistors 301, 305, 306 and 307 are turned on.

Further, the transistor 308 is also turned on. Regarding the transistor 308, the fourth node N4 is charged until the transistor 308 becomes in a state of Vgs=Vth so that no current flows between the source and drain of the transistor 308.

In this regard, Vgs is a gate-to-source voltage based on the source of the transistor 308, and Vth is a threshold voltage of the transistor 308.

Accordingly, in the period t3, the voltage of the first node N1 is the voltage Vdata of the data line Data, the voltage of the fourth node N4 is VDD−Δdrop Vth, the voltage of the capacitor 303 is V(303)=(VDD−Δdrop)−Vdata, and the voltage of the capacitor 304 is V(304)=Vth.

In the period t4, the voltage of the data line Data is switched from V(L) to V(H) in a middle of the period t4, and the voltage of the $n^{th}$ scan line Scan (n) is V(H). The voltage of the $(n-1)^{th}$ light emission control line EM(n−1) is V(H), and the voltage of the $n^{th}$ light emission control line EM(n) is V(H).

By such the voltages applied to the pixel, in the period t4, the transistors 301, 302, 305, 306, 307, 308 and 309 are turned off.

In the period t4, the voltage of the capacitor 303 is V(303)=(VDD−Δdrop)−Vdata, and the voltage of the capacitor 304 is V(304)=Vth.

In the period t5, the voltage of the data line Data is V(M), and the voltage of the $n^{th}$ scan line Scan (n) is V(H). The voltage of the $(n-1)^{th}$ light emission control line EM(n−1) is V(L), and the voltage of the $n^{th}$ light emission control line EM(n) is V(H).

By such the voltages applied to the pixel, in the period t5, the transistors 301, 305, 306, 307, 308 and 309 are turned off, and the transistor 302 is turned on.

In the period t6, the voltage of the data line Data is V(L), the voltage of the $n^{th}$ scan line Scan (n) is V(H), the voltage of the $(n-1)^{th}$ light emission control line EM(n−1) is V(L), and the voltage of the $n^{th}$ light emission control line EM(n) is V(L).

By such the voltages applied to the pixel, in the period t6, the transistors 301, 305, 306, 307 and 308 are turned off, and the transistors 302 and 309 are turned on.

Accordingly, the accumulated charge flows to the anode of the light emitting element 310 through the fourth node N4 and the fifth node N5, and the light emitting element 310 emits a light.

At this time, in the transistor 308 as a driving transistor, Vgs=Vdata+Vth−Vini.

As such, since the voltage variation of the voltage power line is not included in the gate-to-source voltage of the driving transistor during the light emission, the voltage variation of the power voltage line may be compensated.

Moreover, as described above, the signals used in one or more embodiments are the signal of the data line, the signal of the scan line, and the signal of the emission control line. The fixed voltages used in one or more embodiments are the initialization voltage Vini, the power voltage VDD of the high voltage power line, and the power voltage VSS of the low voltage power line. As a result, a low number of the signals and a low number of the fixed voltages are maintained.

Therefore, compared with the related art, a light emitting display device capable of performing initialization of the anode of the light emitting element and the auxiliary capacitor and compensating for the voltage variation of the power voltage line while maintaining a low number of the signals and the fixed voltages may be obtained.

Accordingly, a light emitting display device capable of stably displaying with high quality may be obtained.

It will be apparent to those skilled in the art that various modifications and variations can be made in a display device of the present disclosure without departing from the sprit or scope of the disclosure.

The various embodiments described above can be combined to provide further embodiments. Further changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light emitting display device, comprising:
a plurality of pixels arranged in a matrix form, each of the plurality of pixels including:
a light emitting element having a light emitting diode including an anode and a cathode;
a light emission transistor, one of a source or a drain of the light emission transistor connected to the anode;
a driving transistor, one of a source or a drain of the driving transistor connected to the other of the source or drain of the light emission transistor;
a first transistor, one of a source or a drain of the first transistor connected to the one of the source or drain of the driving transistor and the other of the source or the drain of the light emission transistor;
a second transistor, one of a source or a drain of the second transistor connected to an initialization line having a fixed voltage;
a first capacitor, one electrode of the first capacitor connected to the other of the source or the drain of the second transistor, and the other electrode of the first capacitor connected to a gate of the driving transistor; and
an initialization transistor connected to:
the gate of the driving transistor through the light emission transistor and the first transistor,
the one of the source or the drain of the driving transistor through the light emission transistor, and
the anode, the anode being connected to the initialization voltage line having a fixed voltage through the initialization transistor,
wherein the initialization transistor has a resistance greater than the driving transistor.

2. The device of claim 1, wherein each of the plurality of pixels includes:
a third transistor, a gate of the third transistor is connected to a first scan line, one of a source or a drain of the third transistor is connected to a first node, and the other of the source or the drain of the third transistor is connected to a data line;
the second transistor, a gate of the second transistor is connected to a second scan line, and the other of a source or a drain of the second transistor is connected to the first node;
a second capacitor, one electrode of the second capacitor is connected to the first node, and the other electrode of the second capacitor is connected to a first power line;
the first capacitor, one electrode of the first capacitor is connected to the first node, and the other electrode of the first capacitor is connected to a second node;
the first transistor, a gate of the first transistor is connected to the second scan line, one of the source or the drain of the first transistor is connected to the second node, and the other of the source or the drain of the first transistor is connected to a third node;
the initialization transistor, a gate of the initialization transistor is connected to the second scan line, one of a source or a drain of the initialization transistor is connected to a fourth node, and the other of the source or the drain of the initialization transistor is connected to the initialization voltage line;

the driving transistor, a gate of the driving transistor is connected to the second node, one of a source or a drain of the driving transistor is connected to the third node, and the other of the source or the drain of the driving transistor is connected to the first power line;

the light emission transistor, a gate of the light emission transistor is connected to a light emission control line, one of a source or a drain of the light emission transistor is connected to the third node, and the other of the source or the drain of the light emission transistor is connected to the fourth node; and the light emitting element, the anode of the light emitting element is connected to the fourth node, and the cathode of the light emitting element is connected to a second power line, wherein the second scan line is located at two row lines before the first scan line, wherein the first power line is a high voltage power line which has a voltage greater than a voltage of the initialization voltage line, and wherein the second power line is a low voltage power line which has a voltage less than a voltage of the initialization voltage line.

3. The device of claim 1, wherein each of the plurality of pixels includes:

a third transistor, a gate of the third transistor is connected to a scan line, one of a source or a drain of the third transistor is connected to a first node, and the other of the source or the drain of the third transistor is connected to a data line;

the second transistor, a gate of the second transistor is connected to the scan line, and the other of a source or a drain of the second transistor is connected to a second node;

a fourth transistor, a gate of the fourth transistor is connected to a first light emission control line, one of a source or a drain of the fourth transistor is connected to the first node, and the other of the source or the drain of the fourth transistor is connected to the second node;

a first capacitor, one electrode of the first capacitor is connected to the second node, and the other electrode of the first capacitor is connected to a third node;

a second capacitor, one electrode of the second capacitor is connected to the first node, and the other electrode of the second capacitor is connected to a first power line;

the first transistor, a gate of the first transistor is connected to the scan line, one of a source or a drain of the first transistor is connected to the third node, and the other of the source or the drain of the first transistor is connected to a fourth node;

the initialization transistor, a gate of the initialization transistor is connected to the scan line, one of a source or a drain of the initialization transistor is connected to a fifth node, and the other of the source or the drain of the initialization transistor is connected to the initialization voltage line;

the driving transistor, a gate of the driving transistor is connected to the third node, one of a source or a drain of the driving transistor is connected to the fourth node, and the other of the source or the drain of the driving transistor is connected to the first power line;

the light emission transistor, a gate of the light emission transistor is connected to a second light emission control line, one of a source or a drain of the light emission transistor is connected to the fourth node, and the other of the source or the drain of the light emission transistor is connected to the fifth node; and the light emitting element, the anode of the light emitting element is connected to the fifth node, and the cathode of the light emitting element is connected to a second power line, wherein the first light emission control line is located at one row line before the scan line, wherein the first power line is a high voltage power line which has a voltage greater than a voltage of the initialization voltage line, and wherein the second power line is a low voltage power line which has a voltage less than a voltage of the initialization voltage line.

4. A light emitting display device, comprising:

a plurality of pixels arranged in a matrix form, each of the plurality of pixels including:

a light emitting element having a light emitting diode including an anode and a cathode;

a light emission transistor, one of a source or a drain of the light emission transistor connected to the anode;

a driving transistor, one of a source or a drain of the driving transistor connected to the other of the source or drain of the light emission transistor;

a first transistor, one of a source or a drain of the first transistor connected to the one of the source or drain of the driving transistor and the other of the source or the drain of the light emission transistor;

a second transistor, one of a source or a drain of the second transistor connected to an initialization line having a fixed voltage;

a first capacitor, one electrode of the first capacitor connected to a gate of the driving transistor;

a second capacitor, one electrode of the second capacitor connected to the other of the source or the drain of the second transistor, and the other electrode of the second capacitor connected to the other electrode of the first capacitor; and an initialization transistor connected to:
the gate of the driving transistor through the light emission transistor and the first transistor,
the one of the source or the drain of the driving transistor through the light emission transistor, and
the anode, the anode being connected to the initialization voltage line through the initialization transistor, wherein the initialization transistor has a resistance greater than the driving transistor.

5. The device of claim 1, wherein a width to length ratio of a current direction in a channel layer of the initialization transistor is less than a width to length ratio of a current direction in a channel layer of the driving transistor.

6. The device of claim 1, wherein a channel length of the initialization transistor is greater than a channel length of the driving transistor, and a channel width of the initialization transistor is less than a channel width of the driving transistor.

7. The device of claim 1, wherein a gate of the first transistor and a gate of the initialization transistor are connected to each other.

8. The device of claim 4, wherein each of the plurality of pixels includes:

a third transistor, a gate of the third transistor is connected to a scan line, one of a source or a drain of the third transistor is connected to a first node, and the other of the source or the drain of the third transistor is connected to a data line;

the second transistor, a gate of the second transistor is connected to a first light emission control line, and the other of a source or a drain of the second transistor is connected to the first node;

the second capacitor, one electrode of the second capacitor is connected to the first node, and the other electrode of the second capacitor is connected to a second node;

the first capacitor, one electrode of the first capacitor is connected to the second node, and the other electrode of the first capacitor is connected to a third node;

a fourth transistor, a gate of the fourth transistor is connected to the scan line, one of a source or a drain of the fourth transistor is connected to the second node, and the other of the source or the drain of the fourth transistor is connected to a first power line;

the first transistor, a gate of the first transistor is connected to the scan line, one of a source or a drain of the first transistor is connected to the third node, and the other of the source or the drain of the first transistor is connected to a fourth node;

the initialization transistor, a gate of the initialization transistor is connected to the scan line, one of a source or a drain of the initialization transistor is connected to a fifth node, and the other of the source or the drain of the initialization transistor is connected to the initialization voltage line;

the driving transistor, a gate of the driving transistor is connected to the third node, one of a source or a drain of the driving transistor is connected to the fourth node, and the other of the source or the drain of the driving transistor is connected to the first power line;

the light emission transistor, a gate of the light emission transistor is connected to a second light emission control line, one of a source or a drain of the light emission transistor is connected to the fourth node, and the other of the source or the drain of the light emission transistor is connected to the fifth node; and the light emitting element, the anode of the light emitting element is connected to the fifth node, and the cathode of the light emitting element is connected to a second power line, wherein the first light emission control line is located at one row line before the scan line, wherein the first power line is a high voltage power line which has a voltage greater than a voltage of the initialization voltage line, and wherein the second power line is a low voltage power line which has a voltage less than a voltage of the initialization voltage line.

* * * * *

UNITED STATES PATENT AND TRADEMARK OFFICE
CERTIFICATE OF CORRECTION

PATENT NO. : 11,107,391 B2
APPLICATION NO. : 16/703013
DATED : August 31, 2021
INVENTOR(S) : Shinji Takasugi Page 1 of 1

It is certified that error appears in the above-identified patent and that said Letters Patent is hereby corrected as shown below:

In the Claims

Column 16, Claim 1, Lines 36-37:
"voltage line having a fixed voltage though the initialization transistor," should read: -- voltage line through the initialization transistor, --.

Signed and Sealed this
Sixth Day of September, 2022

Katherine Kelly Vidal
*Director of the United States Patent and Trademark Office*